United States Patent [19]
Doty et al.

[11] Patent Number: 5,554,929
[45] Date of Patent: Sep. 10, 1996

[54] CRESCENT GRADIENT COILS

[75] Inventors: F. David Doty; James K. Wilcher, both of Columbia, S.C.

[73] Assignee: Doty Scientific, Inc., Columbia, S.C.

[21] Appl. No.: 30,853

[22] Filed: Mar. 12, 1993

[51] Int. Cl.$^6$ ................................................ G01R 33/20
[52] U.S. Cl. ............................................................ 324/318
[58] Field of Search ..................................... 324/300, 307, 324/309, 318, 319, 320, 322; 128/653.5

[56] References Cited

U.S. PATENT DOCUMENTS

| | | | |
|---|---|---|---|
| 2,354,331 | 7/1944 | Polydoroff | 175/242 |
| 2,498,475 | 2/1950 | Adams | 324/318 |
| 3,237,090 | 2/1966 | Royer et al. | 323/45 |
| 3,466,499 | 9/1969 | Beth | 313/84 |
| 3,569,823 | 3/1971 | Golay | 324/300 |
| 3,671,902 | 6/1972 | Westendorp | 336/84 |
| 3,924,211 | 12/1975 | Joffe et al. | 335/284 |
| 4,038,622 | 7/1977 | Purcell | 335/216 |
| 4,165,479 | 8/1979 | Mansfield | 324/300 |
| 4,514,586 | 4/1985 | Waggoner | 174/35 MS |
| 4,642,569 | 2/1987 | Hayes et al. | 324/318 |
| 4,646,024 | 2/1987 | Schenck et al. | 324/318 |
| 4,646,046 | 2/1987 | Vavrek et al. | 335/301 |
| 4,707,663 | 11/1987 | Minkoff et al. | 324/319 |
| 4,733,189 | 3/1988 | Punchard et al. | 324/318 |
| 4,737,716 | 4/1988 | Roemer et al. | 324/318 |
| 4,766,383 | 8/1988 | Fox et al. | 324/318 |
| 4,768,008 | 8/1988 | Purcell et al. | 335/216 |
| 4,820,988 | 4/1989 | Crooks et al. | 324/318 |
| 4,849,697 | 7/1989 | Cline et al. | 324/306 |
| 4,876,510 | 10/1989 | Siebold et al. | 324/318 |
| 4,885,540 | 12/1989 | Snoddy et al. | 324/318 |
| 4,910,462 | 3/1990 | Roemer et al. | 324/318 |
| 4,920,011 | 4/1990 | Ogawa et al. | 428/596 |
| 4,926,125 | 5/1990 | Roemer | 324/318 |

(List continued on next page.)

FOREIGN PATENT DOCUMENTS

| | | |
|---|---|---|
| 304126 | 2/1989 | European Pat. Off. . |
| 586983 | 3/1994 | European Pat. Off. . |
| 4029477 | 4/1991 | Germany . |
| 54-38792 | 3/1979 | Japan . |
| 2050062 | 12/1980 | United Kingdom . |

OTHER PUBLICATIONS

Y. Bangert and P. Mansfield, *J. Physics E 15,* "Magnetic Field Gradient Coils for NMR Imaging," 235 (1982).

P. Mansfield and B. Chapman, *J. Magnetic Resonance 66,* "Active Magnetic Screening of Gradient Coils in NMR Imaging," 573–576 (Feb. 1986).

P. Mansfield and B. Chapman, *J. Magnetic Resonance 72,* "Multishield Active Magnetic Screening of Coil Structures in NMR," 211 (1987).

M. K. Stehling, R. Turner, P. Mansfield, *Science 254,* "Echo–Planar Imaging: Magnetic Resonance Imaging in a Fraction of a Second," 43 (1991).

E. C. Wong et al., Magnetic Resonance in Medicine, vol. 21, 1 Sep. 1991, pp. 39–48.

V. Bangert et al., Journal of Physics E. Scientific Instuments, vol. 15, 1 Feb. 1982, pp. 235–239.

J. P. Boehmer et al., Journal of Magnetic Resonance, vol. 83, 1 Jun. 1989, pp. 152–159.

*Primary Examiner*—Gerard R. Strecker
*Assistant Examiner*—Raymond Y. Mah
*Attorney, Agent, or Firm*—Oppedahl & Larson

[57] ABSTRACT

A high-conductivity ceramic coil form with an internal water jacket is used to simplify water cooling for 3-axis MRI gradient coil configurations on a single cylindrical coilform. Crescent-shaped, axially aligned coils are symmetrically employed on either side of the axial symmetry plane to increase transversely the region of field linearity. These crescent coils may be used in conjunction with Golay-type coils for improved switching efficiency. Lead-filled copper tubing may be used to reduce acoustic noise from pulsed coils in high external magnetic fields.

37 Claims, 11 Drawing Sheets

U.S. PATENT DOCUMENTS

| | | | |
|---|---|---|---|
| 4,935,714 | 6/1990 | Vermilyea | 335/299 |
| 4,954,781 | 9/1990 | Hirata | 324/318 |
| 4,965,521 | 10/1990 | Egloff | 324/312 |
| 4,978,920 | 12/1990 | Mansfield | 324/318 |
| 5,036,282 | 7/1991 | Morich et al. | 324/318 |
| 5,061,891 | 10/1991 | Totsuka et al. | 324/146 |
| 5,084,676 | 1/1992 | Saho et al. | 324/318 |
| 5,132,621 | 7/1992 | Kang et al. | 324/322 |
| 5,166,619 | 11/1992 | Ries | 324/318 |
| 5,185,577 | 2/1993 | Minemura | 324/318 |
| 5,198,769 | 3/1993 | Frese et al. | 324/318 |
| 5,225,782 | 7/1993 | Laskaris et al. | 324/318 |
| 5,235,283 | 8/1993 | Lehne et al. | 324/318 |

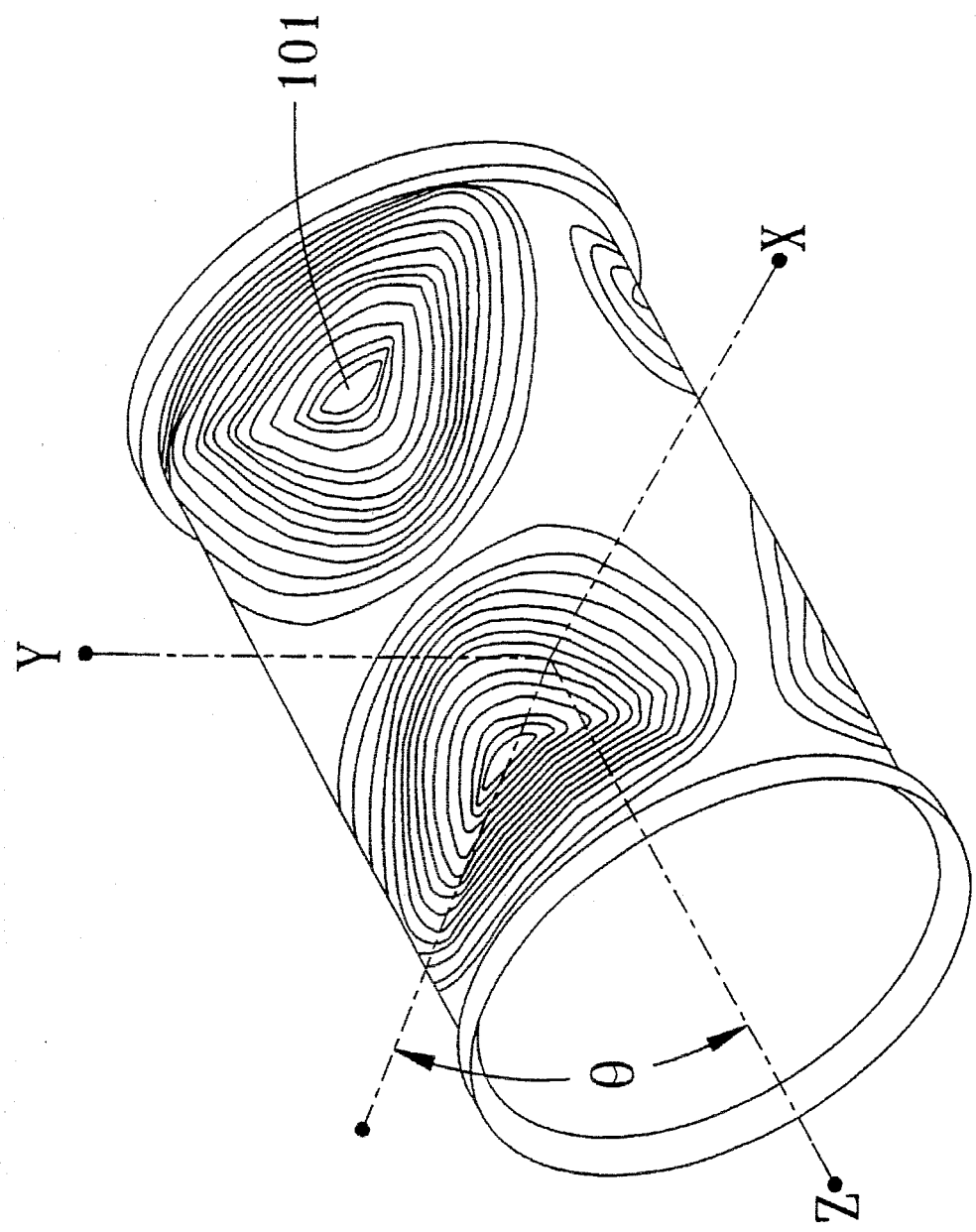
Figure 1 : Prior Art

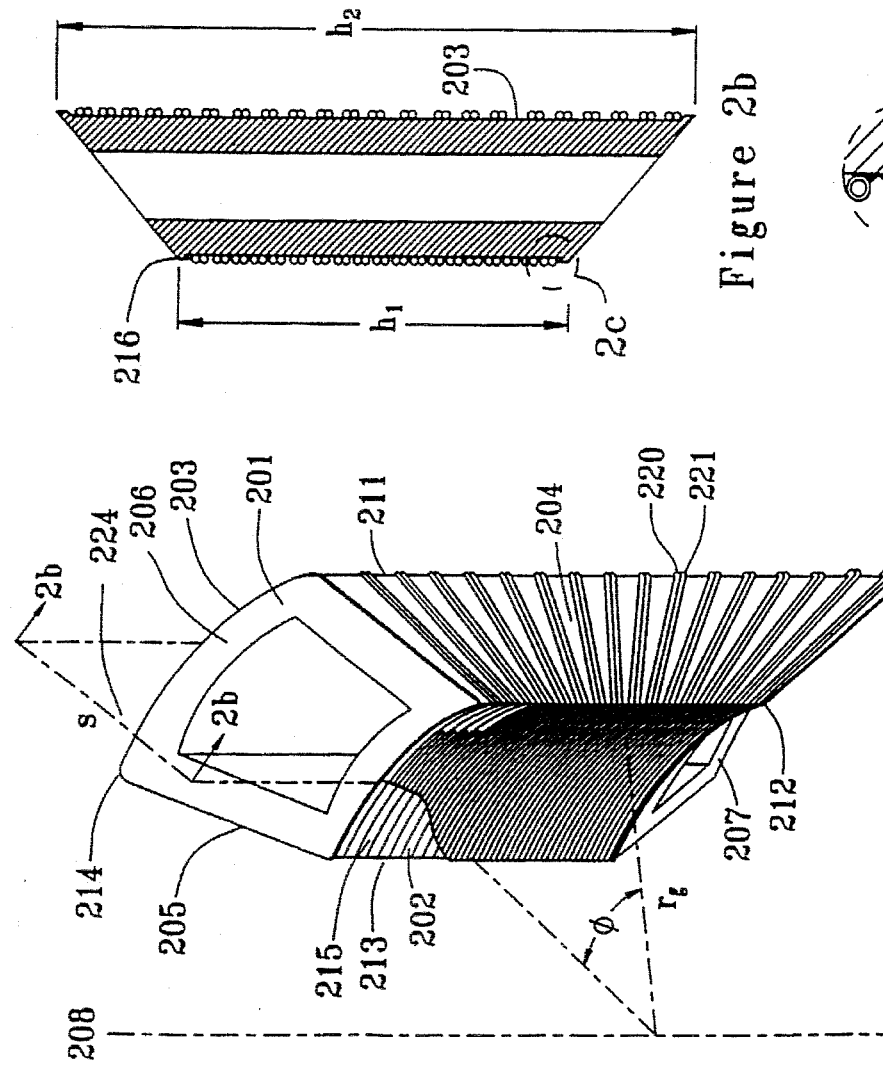
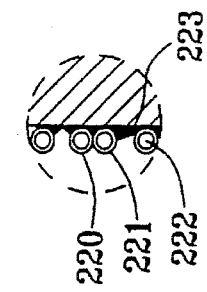
Figure 2a
Figure 2b
Figure 2c

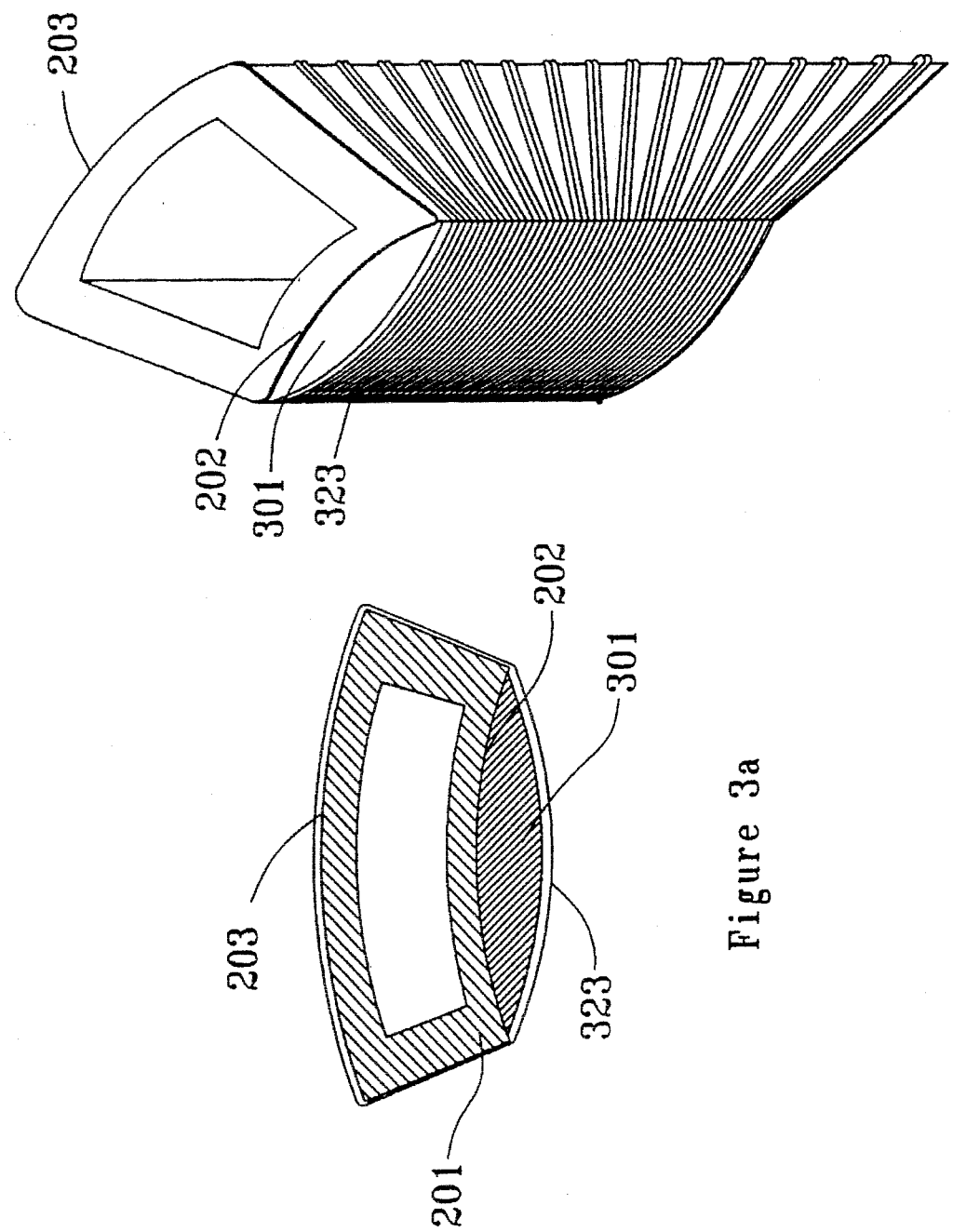

CROSS SECTION OF THE YZ PLANE

CRESCENT GRADIENT COILS

FIELD OF THE INVENTION

The field of this invention is electromagnetic coils for the purpose of efficiently generating gradients, especially in magnetic resonance imaging (MRI) and other gradient techniques employing a superconducting magnet.

BACKGROUND OF THE INVENTION

Most modern MRI systems use a superconducting solenoid to establish a uniform $B_O$ (or $B_Z$) over the imaging volume. This results in the magnetic field being collinear with the path available for sample access. Coils are then required to produce monotonic, (preferably linear) gradients in $B_z$ with respect to x, y, and z over the sample region during precisely determined pulse sequences. The transverse gradients ($\delta B_z/\delta x$, $\delta B_z/\delta y$) in the prior art have generally been established by symmetrically located sets of saddle coils, similar to those first described by Golay in U.S. Pat. No. 3,569,823 or by related planar coils as disclosed by Roemer, U.S. Pat. No. 4,926,125 and Morich et al, U.S. Pat. No. 5,036,282. Maxwell pairs or related geometries are universally used to generate the axial gradient. A co-pending application, Ser. No. 07/912,149, discloses the use of coil geometries more complex than surface currents to achieve order-of-magnitude improvements in several critical parameters for transverse gradient coils: acoustic noise and DC gradient efficiency.

The instant application discloses (a) the combined use of Golay-type and crescent-coil geometries for greatly improved switching efficiency and (b) the convenience of internal water cooling with transverse gradients. The closest prior art to the instant invention, in terms of magnetic field configuration, appear to be the trapezium loops for use with an electromagnet, as disclosed in the article "Magnetic Field Gradient Coils for NMR Imaging" by Bangert and Mansfield in Journal Physics, E, 15, 235 (1982), some screening concepts disclosed by Mansfield in U.S. Pat. No. 4,978,920, and the above referenced co-pending patent application.

The gradient pulses induce eddy currents and vibrations in nearby conducting structures (especially in flimsy shields, in the cryostat, and in lightweight rf coils) which perturb the field homogeneity following the pulses with time and spatial dependencies that are not easily characterized. Actively shielded coils for MRI were first publicly disclosed by Mansfield in February 1986 at approximately the same time that Roemer filed the patent application which resulted in U.S. Pat. No. 4,737,716. Prior independent work was underway at Doty Scientific, which shipped the first such commercially available NMR gradient coils in January 1987. Actively shielded dipolar coils for energy storage were previously disclosed by Westendorp, U.S. Pat. No. 3,671,902. Actively shielded, constant-gradient, quadrupolar magnetic field coils based on cylindrical current sheets for atomic beam confinement and focusing were previously disclosed by Beth, U.S. Pat. No. 3,466,499.

FIG. 1 approximately depicts the fingerprint coils of Schenck, Hussain, and Edelstein, U.S. Pat. No. 4,646,024, as used to generate $\delta B_z/\delta y$ in an imaging region in the sample. Such a pattern achieves both higher linearity and higher switching efficiency than first-order Golay coils A similar set of concentric coils rotated 90°, is used to generate $\delta B_z/\delta x$.

The major gradient design problems center on the following: (1) limited available space because of economic considerations, (2) motion-induced artifacts arising from the finite stiffness and mass of the coil support structure, (3) practicable coil winding (or etching) techniques, (4) acoustic noise abatement, (5) heat dissipation, and (6) minimization of transverse field components.

The conflicting technical requirements may be partially addressed by means of local planar gradient coils with highly nonlinear response, as disclosed by Roemer, U.S. Pat. No. 4,926,125. By adding distortion correction algorithms to the image processing, it is possible to use gradients with ±40% to ±60% non-linearity on one axis in applications where high spatial resolution is required only over a small portion of the image.

The following parameters generally need to be specified for gradient coil systems: gradient coefficient $\alpha$ (T/Am) (sometimes called gradient efficiency in the prior art), imaging sphere diameter $d_i$ (m) for a specified linearity deviation, inductance L (H), resistance $R_E$ ($\Omega$), maximum continuous power dissipation P (W), maximum pulse current $I_P$ (A) in a specified $B_O$, recovery time $T_D$ (s) for a specified pulse, acoustic noise for a specified pulse sequence in a specified field, and ratio of transverse field energy in the sample region to axial field energy in the imaging region.

For the fastest imaging technique, Echo Planar Imaging (EPI) and related techniques, the most important parameters are recovery time, gradient switching efficiency, transverse fields, and acoustic noise. Although EPI was first described more than 15 years ago, it has seldom been used because prior art gradient coils (a) may require megawatts of gradient driver power on the frequency-encoding axis, (b) generate sound pressure levels that are painful and damaging to the patient's hearing, (c) produce motion-related artifacts that cannot be fully removed even with the most sophisticated image postprocessing, and (d) require high power audio amplifiers costing up to several million dollars. A recent experimental demonstration at 0.5 T required nearly half a megawatt (at 10% duty cycle) at 1 kHz, and others have proposed the use of 2 MW at 5 kHz, 1.5 T, and 50% duty cycle for slice-interleaved EPI techniques. The above problems may be partially addressed using a tuned transverse gradient with sinusoidal (monochromatic) current; but the conventional gradient coil has very low electrical Q; and there are penalties in SNR and heat dissipation. Also, computational analysis becomes more complex, but the software is available.

While the Maxwell z-gradient is considerably more efficient than the Golay transverse gradient, the frequency-encoding gradient must be in the plane of the image, which often must be transverse for medical reasons. Therefore, improvements are needed in transverse gradients.

The image artifact problem can begin to be appreciated by noting that while the frequency-encoding gradient may be driven with a 500 kVA trapezoidal waveform, the phase-encoding gradient is being driven with short "blips" of several kilowatts at very low duty cycle, and the slice-selection axis is nulled. It is quite easy for nonlinear, vibration-dependent couplings between the frequency-encoding axis and the other axes to destroy the required degree of orthogonality between the axes and produce phase-related artifacts.

It should be pointed out that there is ambiguity in the definition and usage of the term "linearity" in the MRI gradient literature. Henceforth, we use this term to indicate the rms deviation of local field slope compared to the mean field slope over a specified volume. This definition is generally more demanding and a better indicator of image quality than the more common definition where linearity is defined as the maximum gradient field deviation relative to a linear field at any point in the sample, as the latter definition averages local fluctuations along the gradient axis. Other definitions can be less demanding and less useful.

The availability of better image processing and distortion correction techniques suggests that the rms gradient deviation a be increased to 14% compared to the more typical 10% value for many prior art gradients, to increase imaging volume. It is still important that the field be monotonic, but the method of Schenck et al in U.S. Pat. No. 4,646,024 results in relatively poor switching efficiency, intolerable acoustic noise, and unmanageable motion-related artifacts.

The enormous bandwidth (several MHz) of high-resolution EPI (and other more advanced techniques) can reduce the imaging time by two or three orders of magnitude without placing unrealistic demands on modern computers since computational power per cost has increased at the rate of 40% per year for the past seven years and that rate is expected to continue for several more years. Designing for strong gradients with larger gradient non-linearity with very fast switching places increased (though inconsequential) computational demands on the image processing. While there may be some increased variation in SNR over the final image, this is more than offset by the increased data rate.

In practice, using conventional shielded gradient coils, the inductive energy ($I^2L/2$) is larger than suggested by simple energy estimates by a substantial factor. In a co-pending patent application, methods are disclosed that allow increases in $\alpha^2/L$ by factors of 2 to 10 compared to prior art Golay coils. However, for large systems the most important efficiency figure-of-merit often is $\eta_s = \alpha^2 d_i^4 h_i/\mu_o L$ where $h_i$ is the imaging region field-of-view in the axial direction. The instant invention allows increases in $\eta_s$ by factors of 2 to 20 compared to prior art.

Some prior gradient coil designs have also suffered under the false notion that there is an inherent advantage with very low inductance coils. Higher inductance (more turns) requires higher voltage, but not higher power (VA) for the same switching time. In fact, reducing inductance below 100 μH is detrimental as lead inductance and transmission line problems then becomes significant. Coil orthogonality (for isolation) and net force cancellation both dictate that integral number of turns be used in all coil sets and coil subsets. Hence, the accuracy of the shielding is limited from this quantization. The more turns, the more precisely the gradients can be shielded. Optimum number of turns is thus determined largely by the VA characteristics and economics of available power devices, magnetic shielding accuracy requirements, and standard wire insulation practice, making 250 V to 800 V (peak differential voltages for a balanced line) at 20 A to 300 A best for large systems. Optimum inductance is typically 0.2 to 1 mH.

SUMMARY OF THE INVENTION

A high-conductivity ceramic coil form with an internal water jacket is used to simplify water cooling for 3-axis MRI gradient coil configurations on a single cylindrical form. Crescent-shaped, axially aligned coils are symmetrically employed on either side of the axial symmetry plane to increase transversely the region of field linearity. These crescent coils may be used in conjunction with Golay-type coils for improved switching efficiency. Lead-filled copper tubing may be used to reduce acoustic noise from pulsed coils in high external magnetic fields.

BRIEF DESCRIPTION OF THE DRAWINGS

FIG. 1 illustrates the prior-art, shielded, fingerprint, transverse gradient coil in the spherical coordinate system;

FIG. 2a–2c disclose a tapered crescent coil with two parallel windings of lead-filled copper tubing;

FIGS. 3a and 3b illustrate a method of winding a coil on a coilform that has a concave surface;

DETAILED DESCRIPTION OF THE PREFERRED EMBODIMENT

Figures 4A, 4B:
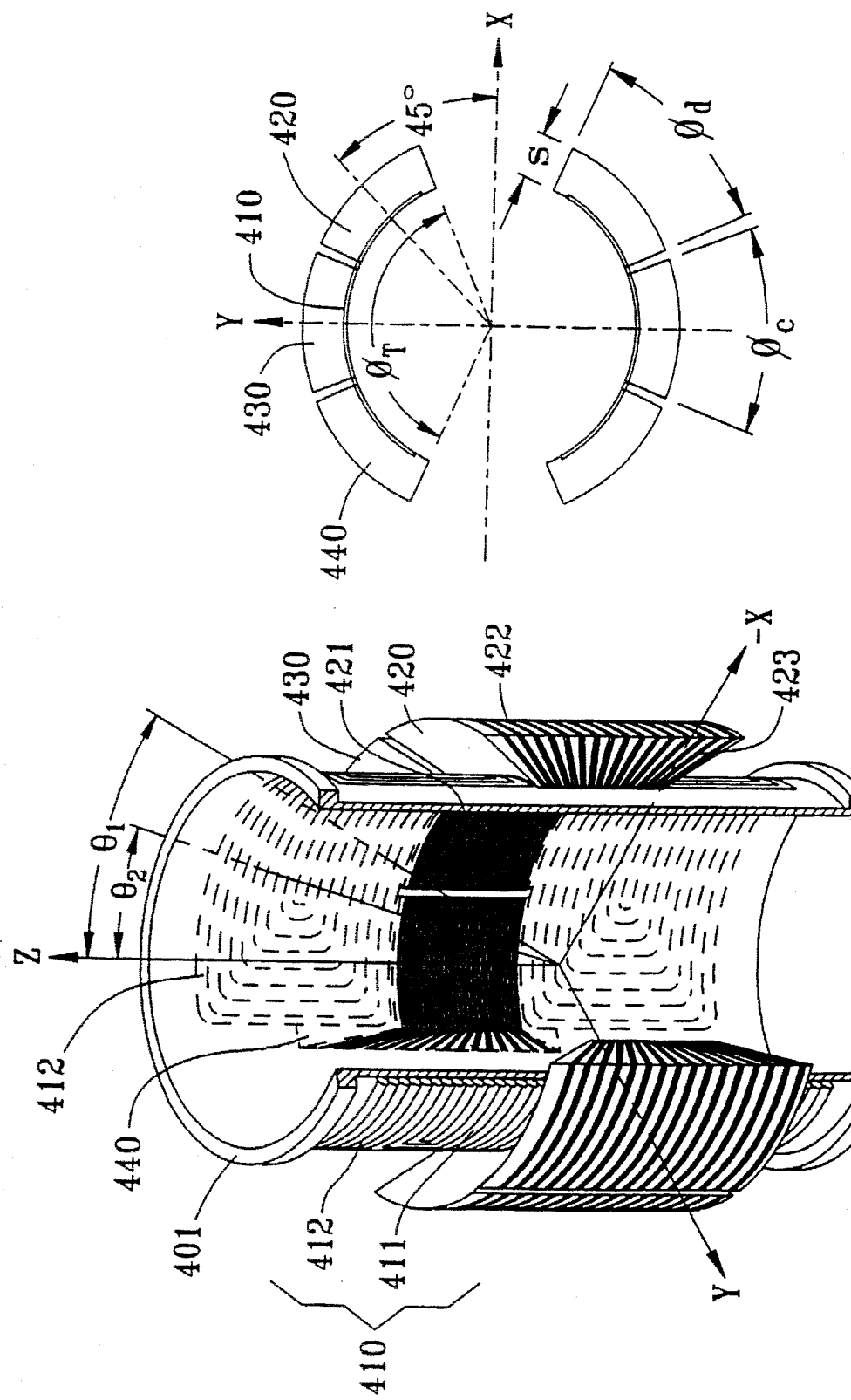
FIGS. 4a and 4b disclose a transverse gradient coil system using a Golay coil and three axially oriented crescent coils on each side.

Qualitative comparisons of various gradient coil geometries of different sizes are often misleading because of the complex expressions for power, inductance, resistance, and gradient coefficient and the varying degrees of sensitivity to coil motion. For example, power is often proportional to the radius to the fifth power for constant winding thickness and voxel size, but power is often linear with radius for constant number of voxels and constant relative winding thickness, depending on the relative significance of $\gamma G d_i T_2$ and SNR (signal to noise ratio) in the determination of spatial resolution. Here, $\gamma$ is the magnetogyric ratio, G is the magnetic field gradient (T/m), $d_i$ is the imaging diameter, and $T_2$ is the spin-spin relaxation time (s). Thus, it is useful to develop dimensionless figures of merit for comparison of various gradient coil systems of various sizes.

We define a switching figure-of-merit, or switching efficiency, $\eta_s$:

$$\eta_s = \frac{\alpha^2 d_i^4 h_i}{\mu_0 L}, \tag{1}$$

where $\alpha$ is the gradient coefficient (T/Am), $d_i$ is the imaging diameter for 14% rms gradient deviation $\sigma$, $h_i$ is the axial imaging length for the same deviation, $\mu_o$ is the permeability of free space, and L is the inductance. The above definition differs from a previously derived definition by a constant, making it more conveniently expressed as a percent. For a typical ellipsoidal imaging region, it has numeric value between 1% and 20% for shielded Golay coils and 15% to 90% for shielded Maxwell pairs and quadrupolar coils for use in magnets with transverse $B_o$.

Prior-art fingerprint coils as shown in FIG. 1 have typical $\eta_s$ of 10% to 30%, depending primarily on the shielding ratio to gradient radii. The crescent-Golay geometry disclosed in the current application achieves $\eta_s$ of 20% to 90%.

It should be noted that the gradient field produced by Golay or fingerprint coils is predominately in the radial direction near window 101, positioned close to polar angle θ of 45°. This transverse component is of no imaging value, but it is responsible for the majority of the currents induced in the sample, which are to be minimized for patient safety reasons. Largely for this reason, and to enhance rf efficiency, it is not practical for $d_i$ to exceed $1.7r_g$, where $r_g$ is the gradient coil radius, as the induced currents increase rapidly for larger values of $d_i$.

Next we define a low frequency (LF) electrical efficiency $\eta_L$:

$$\eta_L = \left(100 \frac{m}{s}\right) \frac{\alpha^2 d_i^4}{\mu_0 R_E}, \tag{2}$$

where the constant has the units m/s as indicated. This definition differs from an earlier definition by a constant factor, primarily for convenience. This LF efficiency evaluates to 2.5% for a typical prior-art transverse coil designed for $d_i$=84 mm (the copper thickness was about half the skin depth) but values below 1% are typical for large planar transverse gradient coils. Typical values for Maxwell-pairs are near 10%, and there is usually little justification for higher LF efficiency, although values above 40% can be achieved for transverse gradients with octopolar geometries of the co-pending application and crescent-Golay systems of the current application.

The figure of merit governing coil power dissipation during EPI is $Q\eta_s$, but the electrical Q at the switching frequency (e.g., 1600 Hz) cannot easily be determined, except by experimental measurement. The electrical Q is generally proportional to coil volume and the square root of frequency. For shielded whole-body coils at 1600 Hz it is typically 3 to 30.

Optimum conductor thickness in the fingerprint coil in regions where the gradient field is predominately axial is approximately one skin depth (typically 3 mm for copper) at the EPI switching frequency. However, optimum thickness in the vicinity of the window, where large radial components are present, is greater.

Coil motion is one of the most troublesome design limitations in many prior art gradient coils. Golay-type transverse gradient coils in a uniform external magnetic field develop opposite torques which cause the cylindrical coilform to bow in the plane of the z-axis and the desired gradient. The governing equations change radically depending on whether most of the energy in the gradient pulse spectrum is below or above the fundamental mechanical mode to which it is strongly coupled.

We define a high-frequency electro-mechanical efficiency $\eta_{mh}$, (which we want to minimize) as the ratio of mechanical energy in the coils to magnetic energy in the sample and show that for conventional Golay coils it is approximately as follows:

where $t_g$ is the gradient pulse length (s), s is the $$\eta_{mh} = \frac{(r_g B_0 t_g)^2}{2\eta_s \mu_0 s m_c}, \tag{3}$$

difference between the shield coil radius and the gradient coil radius (m), and $m_c$ is the Golay coil mass per quadrant (kg). Clearly, relative mechanical energy during short pulses (electrical excitation frequency high compared to mechanical resonances) is minimized by increasing $\eta_s$, s, and $m_c$ for a given $B_0$ and $t_g$. Since $m_c$ would be expected to increase as the second or third power of $r_g$, it might appear that motion-related problems are reduced by increasing $r_g$. However, $t_g$ (if inversely proportional to the gradient field strength, $B_G$) will generally increase as the second, third, or even fourth power of $r_g$ in large coils, depending on the severity of acoustic noise and the amount of power that can be justified. Thus, electro-mechanical efficiency in the short-pulse limit typically increases with $r_g$ because the pulse lengths must increase. For the Golay-crescent geometry of the instant invention, the constant in the denominator is increased by a factor of four.

Another severe problem that often arises for the high-frequency condition is that $\omega_g$, the dominant frequency component in the gradient pulses, may be close to $\omega_b$, the mechanical bowing mode frequency of the coilform, or close to one of the higher mechanical modes. The single pulse analysis is invalid near mechanical resonance as the initial velocity is no longer zero. Thus, the actual situation is worse by a factor comparable to the mechanical Q, which has been found to lie between 3 and 20 for typical materials and geometries.

The co-pending patent application Ser. No. 07/912,149 discloses the mechanical advantages of small-diameter, solenoidal-like trapezoidal coils external to the imaging region for reducing acoustic problems. By increasing the stiffness, it is then possible to stay below resonance for the strongest couplings, and motion problems are easily eliminated. Also, the trapezoidal coil structures can achieve higher switching efficiency but linearity is inferior unless novel winding densities similar to those of the instant invention are used. The co-pending patent application also discloses that improved switching efficiency and improved shielding can be obtained by interleaving Golay-type coils with trapezoidal solenoidal coils.

According to equation [3], coilform stiffness is not a factor above resonance. Mechanical energy is decreased by simply increasing the mass of the coil. Hence, lead-filled copper tubing can be advantageous when the driving frequency is greater than a mechanical resonance. However, there will always be circumstances in which the coils are driven below mechanical resonance. Thus, it is desirable to mount massive conductors on stiff coilforms so that mechanical efficiency is poor at both low and high frequencies.

A simple method of quantifying shielding effectiveness is to define flux leakage $\Phi_L$ as the relative change in inductance when a passive cylindrical shield is added at radius $r_s$, the radius of the radiation shields in the cryomagnet. This radius will typically be $1.2(r_g+s)$.

$$\Phi_L = \frac{\delta L_s}{L} \tag{4}$$

The above definition has only limited validity, as it does not distinguish between the various field dependencies. The eddy currents are far more sensitive to zero-order and first-order fields than to the high-order fields. The co-pending patent application Ser. No. 07/912,149 discloses dynamic compensation of the low-order eddy currents.

FIG. 2 discloses the crescent coil of the instant invention, which allows substantial improvements in switching efficiency, linearity, and shielding when used with Golay-type coils, especially when s is small compared to $r_g$. Moreover, these improvements are achieved without significant increase in acoustic noise compared to the solenoidal geometries. The thick-walled, crescent coilform 201 is made of a high-modulus, non-magnetic material of high electrical resistivity such as glass-filled polyphthalamide (PPA) or a sialon. The crescent coilform 201 comprises a cylindrical concave surface 202, a cylindrical convex surface 203, radial surfaces 204, 205, and end surfaces 206, 207. The two cylindrical surfaces are concentric and subtend similar azimuthal angles ω with respect to a common axis 208, but the convex surface 203 will typically have greater axial length than that of the concave surface 202 and may subtend a somewhat larger or smaller azimuthal angle φ. The radial surfaces and end surfaces 204, 205, 206, 207 are trapezoidal in shape and may be inclined with respect to the radial direction. The radial surfaces may be slightly convex to facilitate coil winding. The axially oriented edges 211, 212, 213, 214 are radiused to simplify coil winding, and grooves 215 and lips 216 may be added to the arcuate and radial surfaces for the same purpose.

Two parallel coil windings 220, 221 are shown as would be required in some cases, but single windings and multiple-layer windings would often be preferred. For moderately large systems, lead-filled copper tubing may be used for the conductor elements, where each conductor 220, 221 is filled with lead 222. The increased density of Pb is beneficial in reducing acoustic noise and vibrations of the low-frequency transverse modes, according to equation [3]. In very large systems, the radial modes of the crescents could be more troublesome, in which case aluminum strip or tubing would be preferred for the windings. Always, the windings would be securely bonded to the crescent coilform, preferably using a fiber-reinforced thermosetting material, such as epoxy or polyester 223. The crescent is symmetric with respect to a reflection through a plane 224 containing an internal coilform axis.

Novel fixturing is required to wind a coil on a coilform with a concave surface. The technique illustrated in FIGS. 3a and 3b attaches a cylindrical convex-convex spacer 301 to the concave surface 203 that can be removed by etching, melting, dissolving, disassembly, or mechanical machining after the coil is wound. The convex winding elements 323 near the concave surface may then be bent inward and bonded to the concave surface 202. The optimum winding density will always be higher on the concave surface than on the convex surface 203, and it will often be desirable to use two layers on the concave surface and a single layer on the convex surface, which may require a separate winding fixturing operation for each layer. For very large crescent coils, a more convenient approach than winding may be to solder individual segments of properly curved strips or tubing together. Then, different conductor element sizes can be used on the different surfaces.

Another method of producing the required winding on a concave surface would be to start by coating the entire external surface of the crescent coilform with copper film by sputtering, chemical vapor deposition, chemical precipitation, or any other suitable technique. A polymer resist can then be applied and developed by conventional screening or photochemical processes to permit etching of the desired winding or windings. The copper windings can then be electrochemically plated to the desired thickness.

FIG. 4 depicts a thin-walled, nonmetallic, cylindrical coilform 401 of approximate outer radius $r_g$ on which a hybrid y-gradient ($\delta B_z/\delta y$) coil assembly of the instant invention is mounted. The hybrid coil assembly subtends azimuthal angle $\phi_T$ greater than 110° and less than 150°, on each side of the x–z plane Golay coil 410 has first azimuthal members 411 at mean polar angle $\theta_1$ between 48° and 60° and second azimuthal members 412 at mean polar angle $\theta_2$ less than 42°. In FIG. 4, Golay coil 410 appears twice, once in plain view at the left of coil form 401, and again in phantom behind the coil form 401. The latter is shown with its upper winding portions (azimuthal members) 412 and with lower winding portions. The upper winding portions have a center which defines polar angle $\theta_2$, shown in phantom when obscured by coil form 401 and by part of winding portions 412. The lower winding portions, which mirror region 411 in the figure, have a center which defines polar angle $\theta_1$.

Six symmetrically y located crescent coils 420, 430, 440, and their symmetric counterparts on the −y side, are used in place of the solenoidal coils of the co-pending patent application Ser. No. 07/912,149.

The crescents have concave conductor elements 421 at approximate radius $r_g$, convex conductor elements 422 at approximate radius $r_g+s$, and radial conductor elements 423 therebetween.

Diagonal crescents 420, 440 are positioned between the x and y axes with centerline φ at 45° and 135° respectively and subtend azimuthal angles of $\phi_d$ each. Center crescent 430 is centered with respect to the y axis and subtends azimuthal angle $\phi_c$, where $\phi_d+\phi_c\approx86°$. Typically, $\phi_d$ and $\phi_c$ are each approximately 43°.

The axial length $h_1$ on the concave side of the crescents (See FIG. 2) is greater than $r_g/2$ and less than $1.5r_g$. The axial length $h_2$ on the convex side of the crescents is greater than $1.2h_1$ but less than $2.5h_1$. Numerical integration of the Biot-Savart law may be used to optimize windings for various values of $s/r_g$ and various optimization criteria. The surface current density on the concave side of the center crescent is typically about 40% greater than that on the diagonal crescents. Surface current densities on the convex sides of the crescents are typically lower near their ends than near the center. Surface current densities on the concave sides of the crescents are often 20% higher near their ends than near the center. Surface current densities in the Golay coils are typically about 20% higher than the highest current densities in the crescents.

Since the crescent conductor elements form complete loops and are symmetrically inclined with respect to the uniform external field $B_O$, there are no net Lorentz forces or torques on the center-of-mass of any of the crescents to first order. Thus, it is not necessary to be concerned about torsional or positional rigidity of the crescents in the gradient assembly. It is sufficient that the crescent coilforms be made of a material of high modulus to insure that the radial-mode mechanical resonances in the crescents are not excited. The crescents may then be precisely secured in position by epoxy bonding the concave surfaces of the crescents to the surface of the cylindrical coilform 481 without undue concern about rigidity of this cylinder. The elastic modulus of coilform 401 can be as low as 3 GPa in some cases, but elastic modulus above 200 GPa would be preferred for large systems in high $B_0$ to minimize motion-related problems from the Golay coils at low frequencies.

Figure 5:
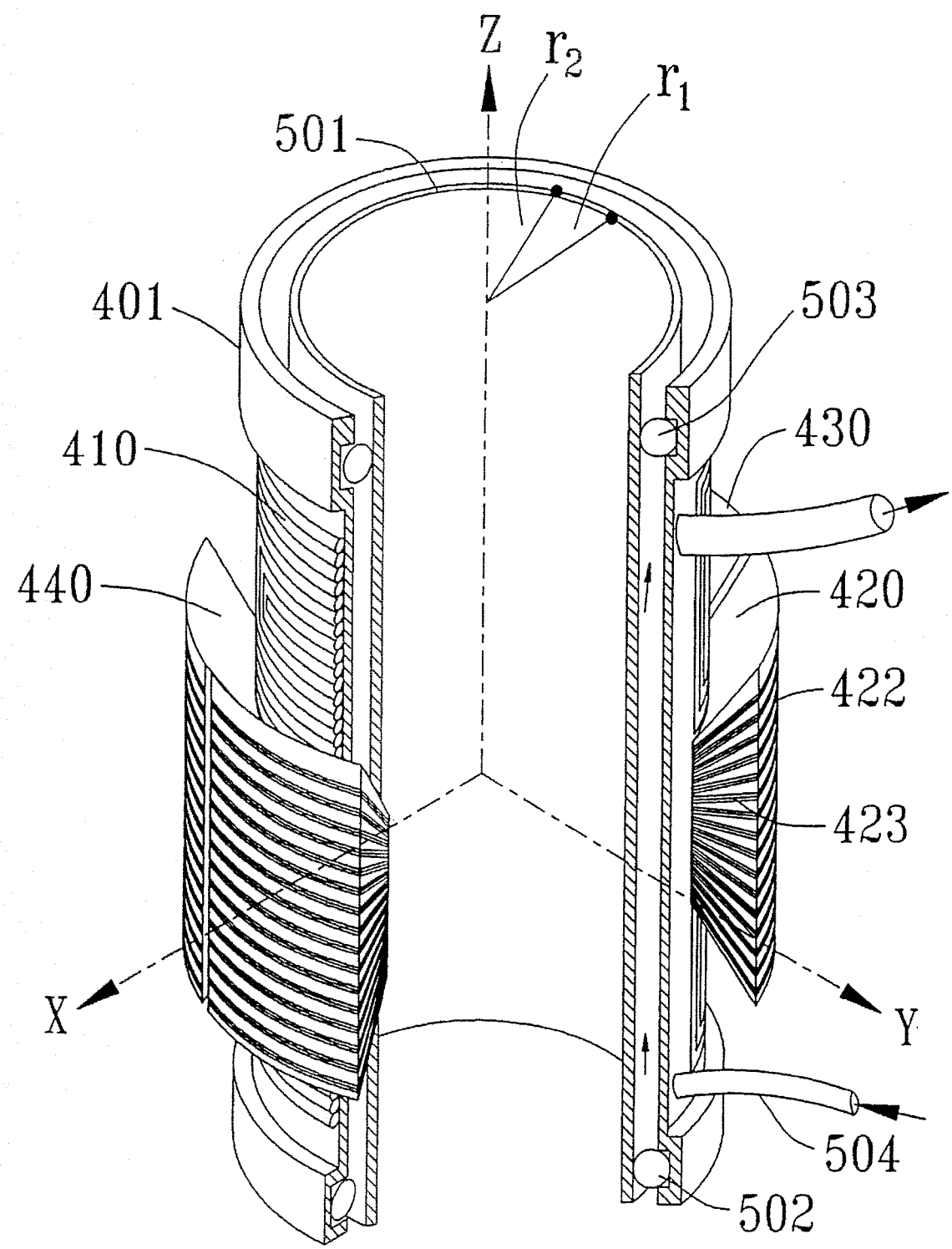
FIG. 5 depicts the use of an internal water cooling jacket.

Forced air cooling over the surfaces of the crescents and Golay coils will often provide sufficient cooling, but in some applications additional cooling will be required. FIG. 5 depicts an effective method of achieving higher power density by providing the benefits of water cooling with fewer of the electrical isolation and plumbing problems associated with conventional water cooling methods. (One prior art technique is to bond plastic plumbing to the surface of the fingerprint coils. Another prior-art technique is to hermetically coat all conductors and then flood the coil assembly with water. Another prior art technique is to use copper tubing for the coils and circulate deionized water directly through the live windings.) The thin-walled coilform 401 is made from a material having high thermal conductivity and high strength, preferably silicon nitride, or alumina, or an alumina-filled composite. An inner thin-walled cylinder 501 of inner radius $r_1$ and outer radius $r_2$ is used to establish an internal cooling water jacket. O-rings 502, 503 may be used for compliant sealing, and plastic plumbing 504 can be used to circulate water through the annular space between the concentric cylinders. The Golay coil 410 bonded to the outer surface of the coilform is easily cooled by conduction. The crescents 420, 430, 440 are well cooled on their concave surfaces, and the high thermal conductivity of the heavy copper windings will usually conduct sufficient heat for adequate cooling of the other surfaces of the crescents. Both forced air cooling and water cooling may be used, allowing more flexibility in the use of the coils. The use of high-modulus, high-strength materials, allows the total relative thickness, $(r_g - r_I)/r_g$, to be less than 0.1.

Figures 6A, 6B:
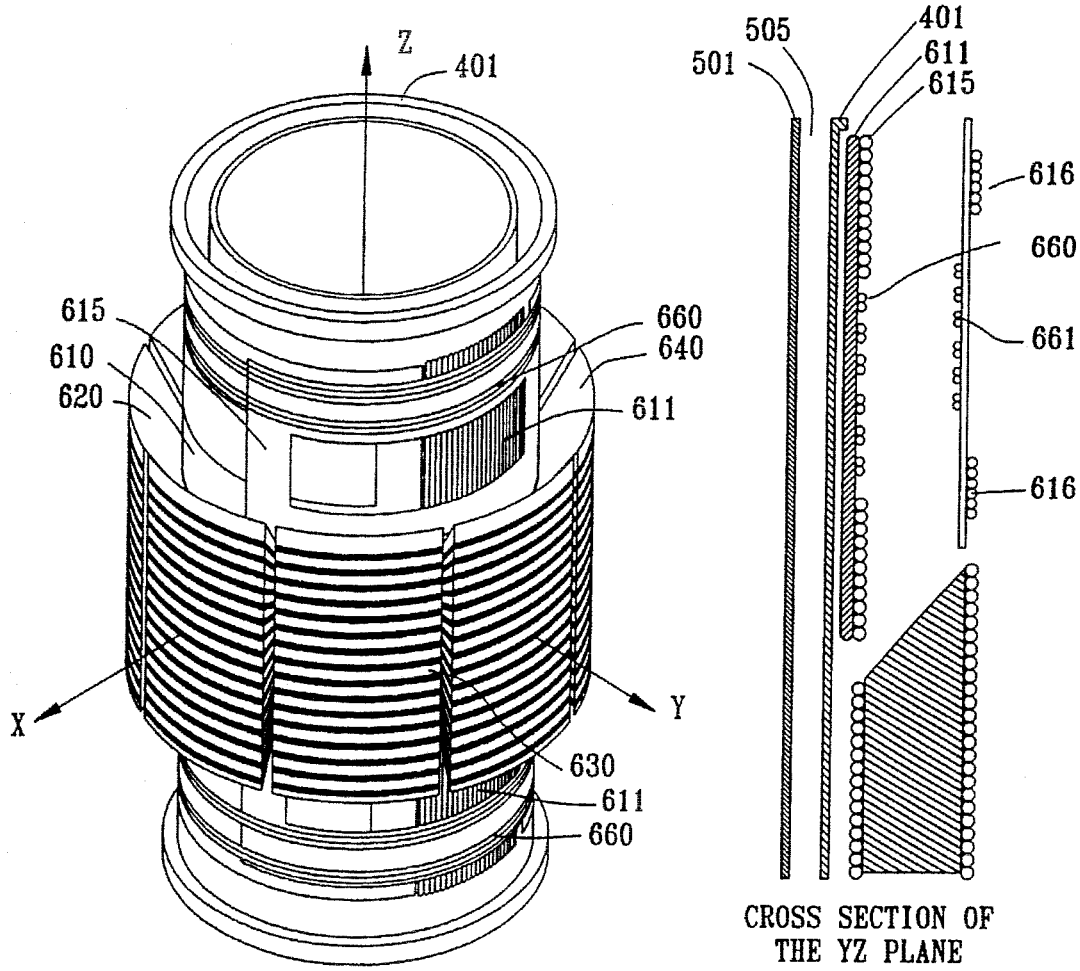
FIGS. 6a and 6b illustrate a preferred 3-axes gradient coil assembly with an internal water cooling jacket.

It will normally be desirable to mount the X, Y, and Z gradients on a single coilform of approximate radius $r_g$ as shown in a perspective view in FIG. 6a and in a cross section of the plus-plus quadrant of the yz plane in FIG. 6b. Note that x-Golay coil 610 and y-Golay coil 615 overlap and that diagonal crescents 620, 630, 640 are used for both the x and y axes. The x–Golay coil 610 and the y–Golay coil 615 are essentially identical except that one is positioned at $\phi+90°$ relative to the other. Clearly, one is also at a slightly larger radius; the z position may also be shifted slightly. Conventional, corrected Maxwell pairs 660 are wound over the Golay coils for the z gradient. The internal water jacket 505 effectively cools all of the windings. Some simplification in the winding of the outer Golay coil (and perhaps some improvement in the cooling of the outer Golay coil) may be obtained by adding spacer material 611, equal in thickness to that of the inner Golay coil, to the surface of the coilform 401 beyond the azimuthal extent of the inner Golay so that the outer Golay has a substantially smooth, cylindrical surface on which to be mounted. For best heat transfer without eddy current problems, this spacer material would consist of a large number of open-ended segments of copper wires.

Optimum positions of external shielding coils 661 for the quadrupolar z-gradient may be determined by the method of Beth, U.S. Pat. No. 3,466,499, or by numerical application of the Biot-Savart law, or by other well-known methods. The octopolar fields produced by the Golay-crescent transverse gradient coils have extremely low external fields, but further shielding Golay coils 616 may still be desired. (Note that these coils are not shown in the isometric view.) Numerical application of the Biot-Savart law is most practical for calculating gradient fields, leakage flux, and total inductance (from the total magnetic energy).

Figure 7:
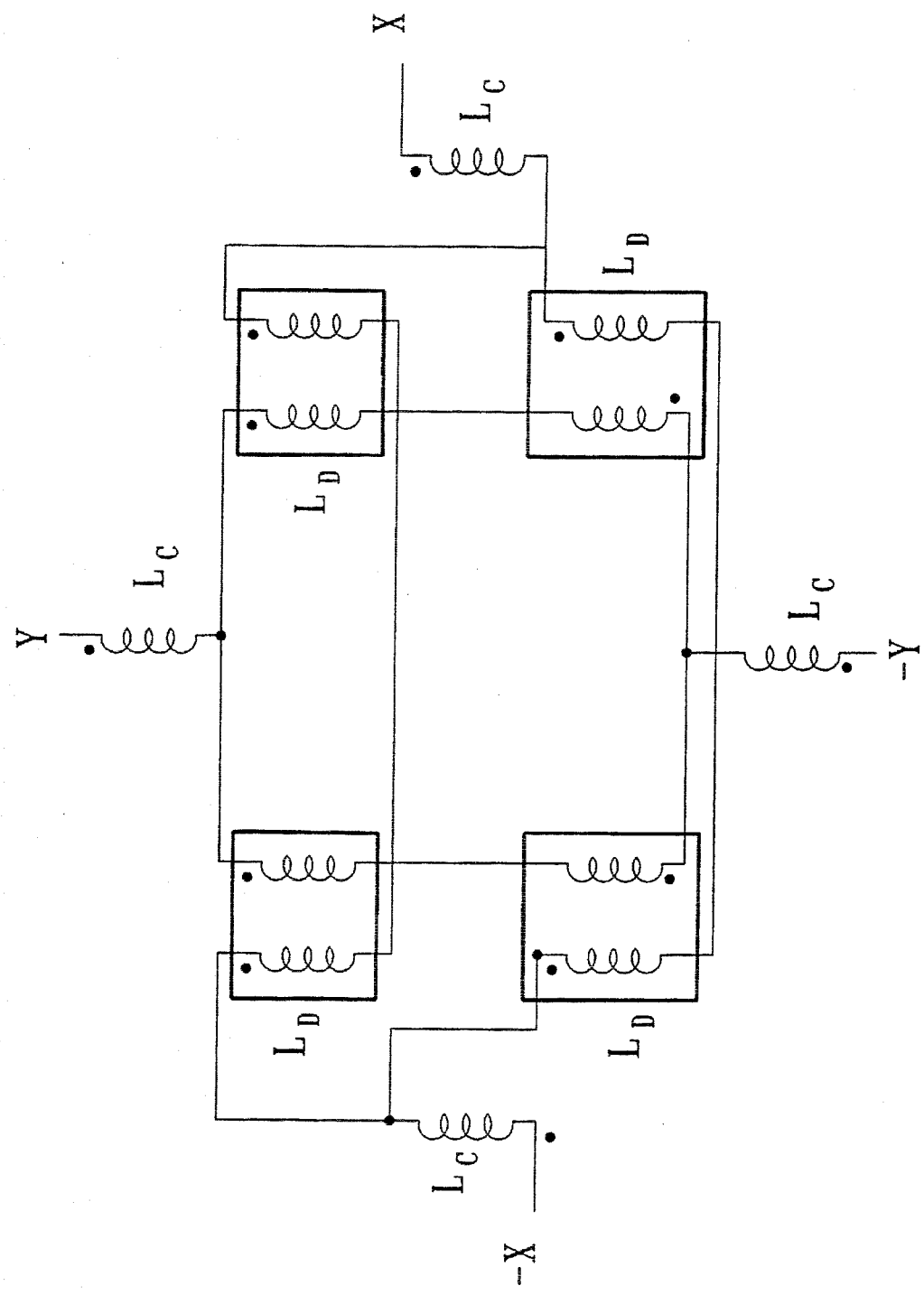
FIG. 7 is a schematic representation of a method of connecting parallel windings to achieve orthogonality.

There are two general methods of orthogonally powering the diagonal crescents. In the first method, the center crescents each have one winding and the diagonal crescents each contain two sets of parallel windings, one set for each transverse axis. Each center crescent would typically have current density 40% greater than that of a single one of the windings on a diagonal crescent. This method has the advantage that each axis requires only one power amplifier. The x-amplifier drives the two crescents on the x-axis and one of the winding sets on each of the four diagonal crescents. The y-amplifier drives the two crescents on the y-axis and the other winding set on each of the diagonal crescents. One possible schematic representation of this approach is shown in FIG. 7. Here, each winding set consists of a single, full-length winding; the +z ends of the crescents are shown with dots, and all of the windings are counter-clockwise when viewed from the +z end. In this case, the center crescents $L_c$ are in series with paralleled diagonal crescents $L_D$, but many other series-parallel arrangements can be devised that produce the desired current densities and maintain orthogonality—that is, result in zero mutual inductance between the axes. The Golay coils are most conveniently wired in series with the crescents on each axis, as it is difficult to accurately calculate the separate inductances, but they can be paralleled with the crescents if the individual and mutual inductances can be accurately determined and matched along with proper resistance match. Of course, the fourfold symmetry allows simple parallel arrangements of the four quadrants with all coils per quadrant in series.

Figure 8:
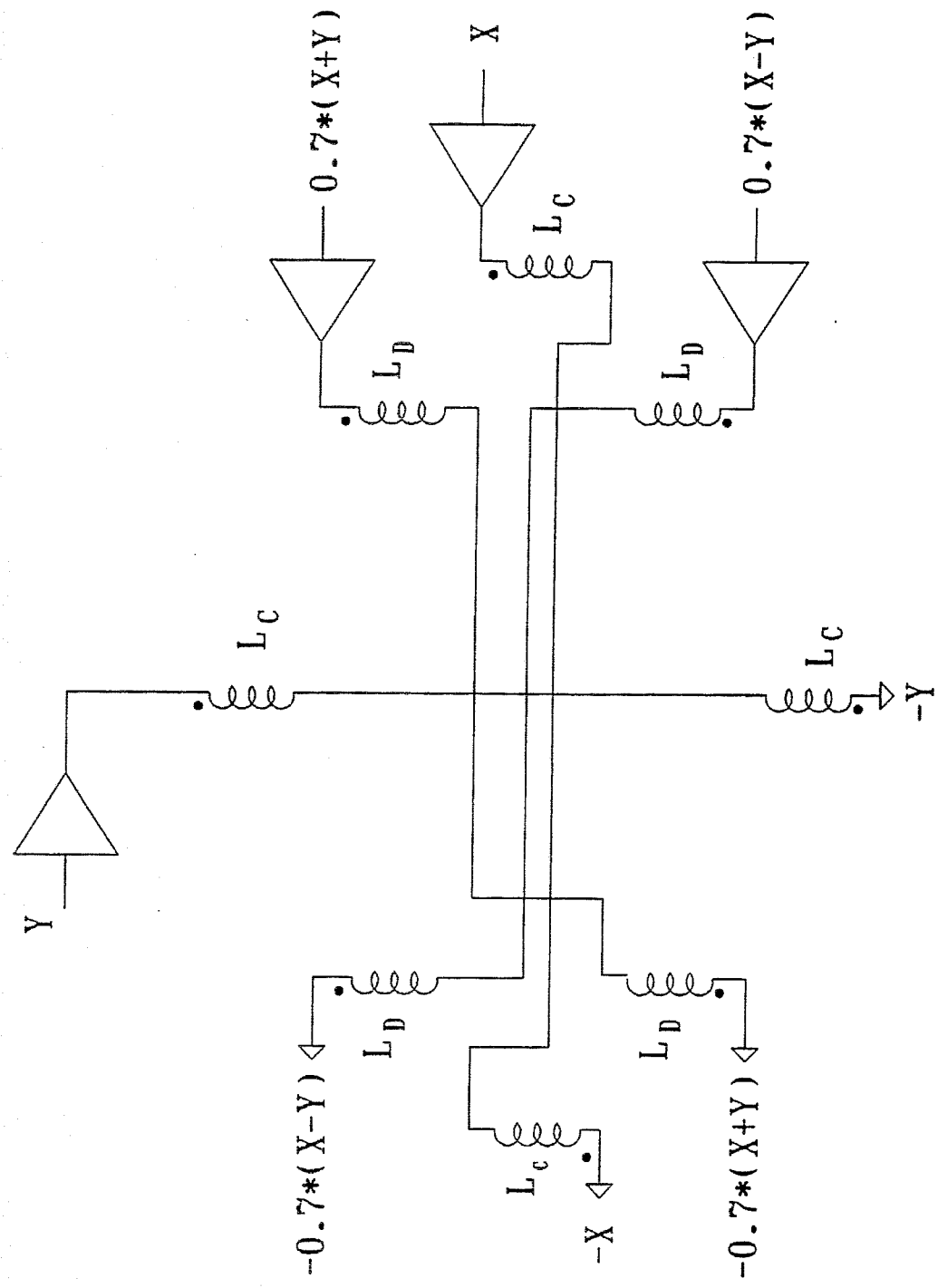
FIG. 8 is a schematic representation of a method of achieving orthogonality using gradient coils with shared windings.

In the second general method, each diagonal crescent has only one winding set that is shared by both axes, but four power amplifiers are required to drive the transverse axes. For purposes of illustration, the four amplifiers are assumed to have equal transconductance and the crescents have equal turns densities. This approach has the advantages of simplified crescent windings and interconnections, easier impedance matching, reduced interwinding capacitance, and higher efficiency. One possible schematic representation to this approach is shown in FIG. 8 using the same conventions as used in FIG. 7. Again, many series-parallel variations are possible that achieve the desired surface current densities on the crescents. The X and Y signals are summed before being fed into the X+Y amplifier, and their difference is fed into the X–Y amplifier. While such a configuration requires a minimum of five amplifiers for an X–Y–Z gradient system compared to three for conventional designs, this approach would often be less expensive in large systems, where amplifier cost is primarily determined by total power. The amplifiers for the center crescents would require higher power rating and perhaps higher output impedance than the diagonal gradient amplifiers since the Golay coils would be connected in series with the center crescents. The voltages driving the diagonal crescents and the diagonal turns densities may, of course, be multiplied by any convenient factor to allow the use of amplifiers of more convenient impedances at the different power levels while achieving the desired relative current densities. In large systems, eight amplifiers would usually be used in a balanced configuration.

The embodiment of FIGS. 4 through 8 uses eight crescents for an X–Y gradient system. Some additional improvement in both switching efficiency and linearity may be obtained in large systems through further azimuthal segmentation for further adjustment of the azimuthal current densities-but with increased complexity and higher cost.

Figure 9:
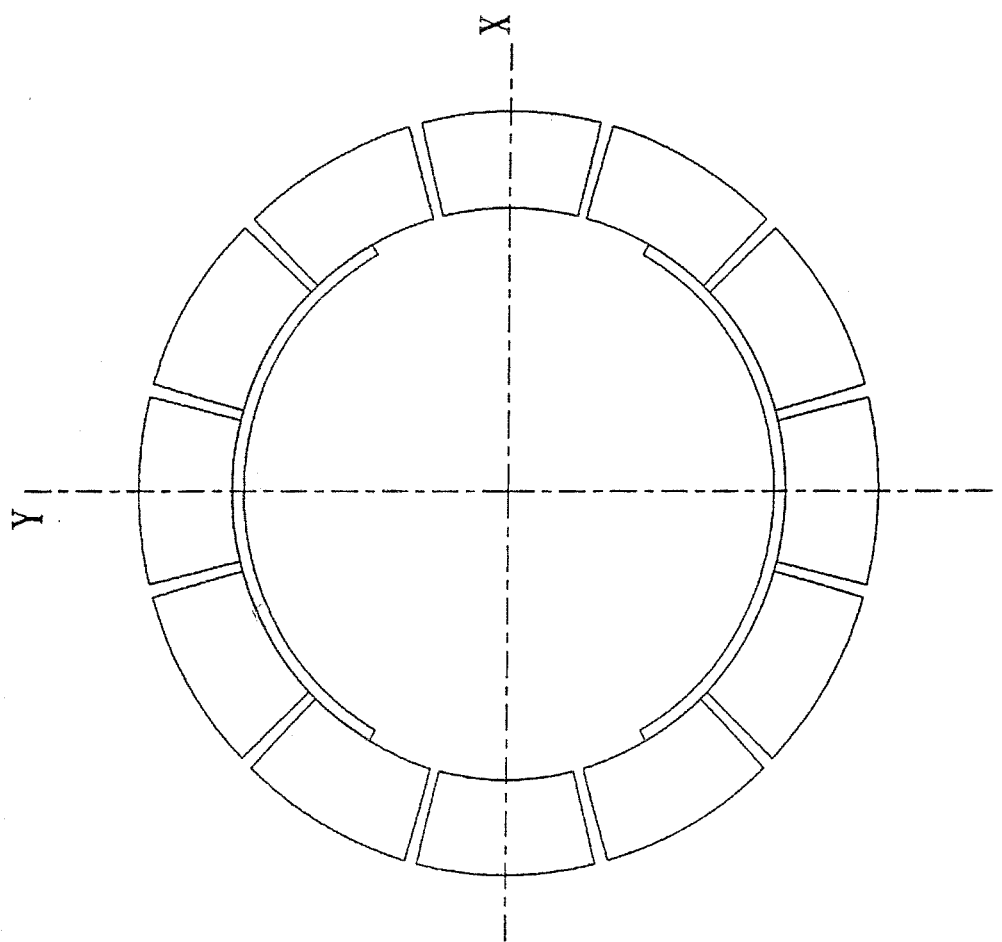
FIG. 9 is a cross section of an X–Y gradient coil system using a Golay coil and twelve axially oriented crescent coils.

FIG. 9 is a cross section through the z=0 plane of an X–Y gradient coil system using 12 crescents. In general, 4n crescents may be used, where n is an integer and the azimuthal current densities in the distributed crescents approximate that of a sine function. For 12 crescents centered at azimuthal positions $\phi=0°, 30°, 60°, 90°, 120°, 150°,$ ... the y-current density at 60° and 120° is approximately 87% of that at 90° and the y-current density at 30° and 150° is approximately half that at 90°. For the case of twelve or more crescents azimuthally, it becomes impractical to achieve the desired current densities on both axes through multiple windings driven by one amplifier per axis in a similar manner to that shown in FIG. 7. However, the method of FIG. 8 using a single winding per crescent can easily be extended to any number of crescents.

Figure 10:
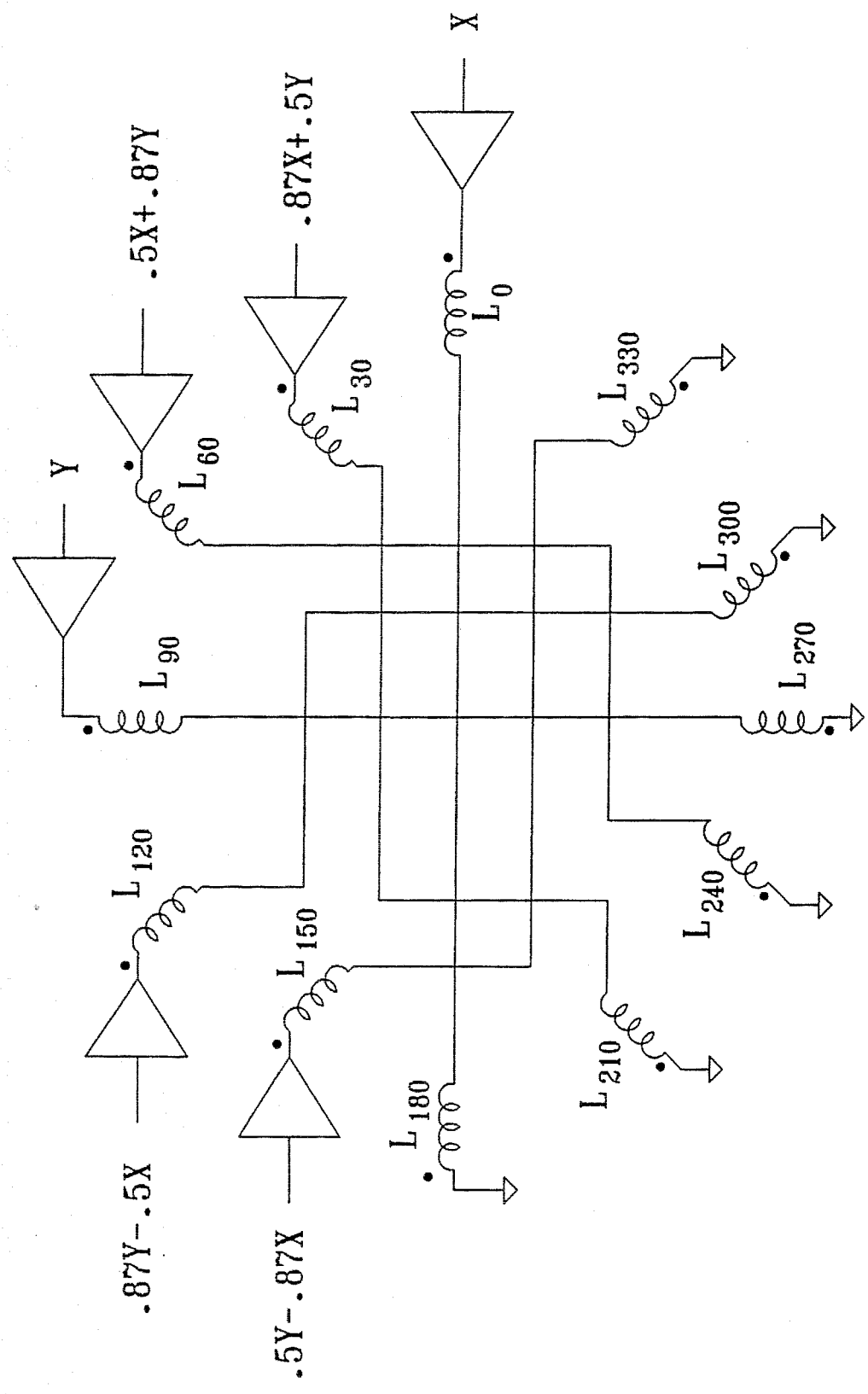
FIG. 10 is a schematic representation of a method of orthogonally powering 12 crescent coils with shared windings.

FIG. 10 is a schematic representation of an arrangement using six amplifiers to drive twelve crescents for an X–Y system. The center crescents are wired in series with the Golay coils, and mixtures of the x and y signals are supplied to the off-axis crescents. Again, the relative voltages (or currents) and the turns densities may be scaled appropriately for more convenient amplifier impedances. The impedances of each crescent in the set at azimuthal positions $\phi$, $\phi+180°$, $-\phi$, and $180°-\phi$ would be identical, but not necessarily related to the impedances of any other set of symmetrically related crescents by any relationship other than amplifier economics. Since the off-axis crescents would require lower power than the center crescents (especially when the Golays are in series with the center crescents), the off-axis crescents would normally be of higher impedance. That is, the off-axis crescents would normally have higher turns density, even though they would be operated at lower current density.

Figures 11A, 11B:
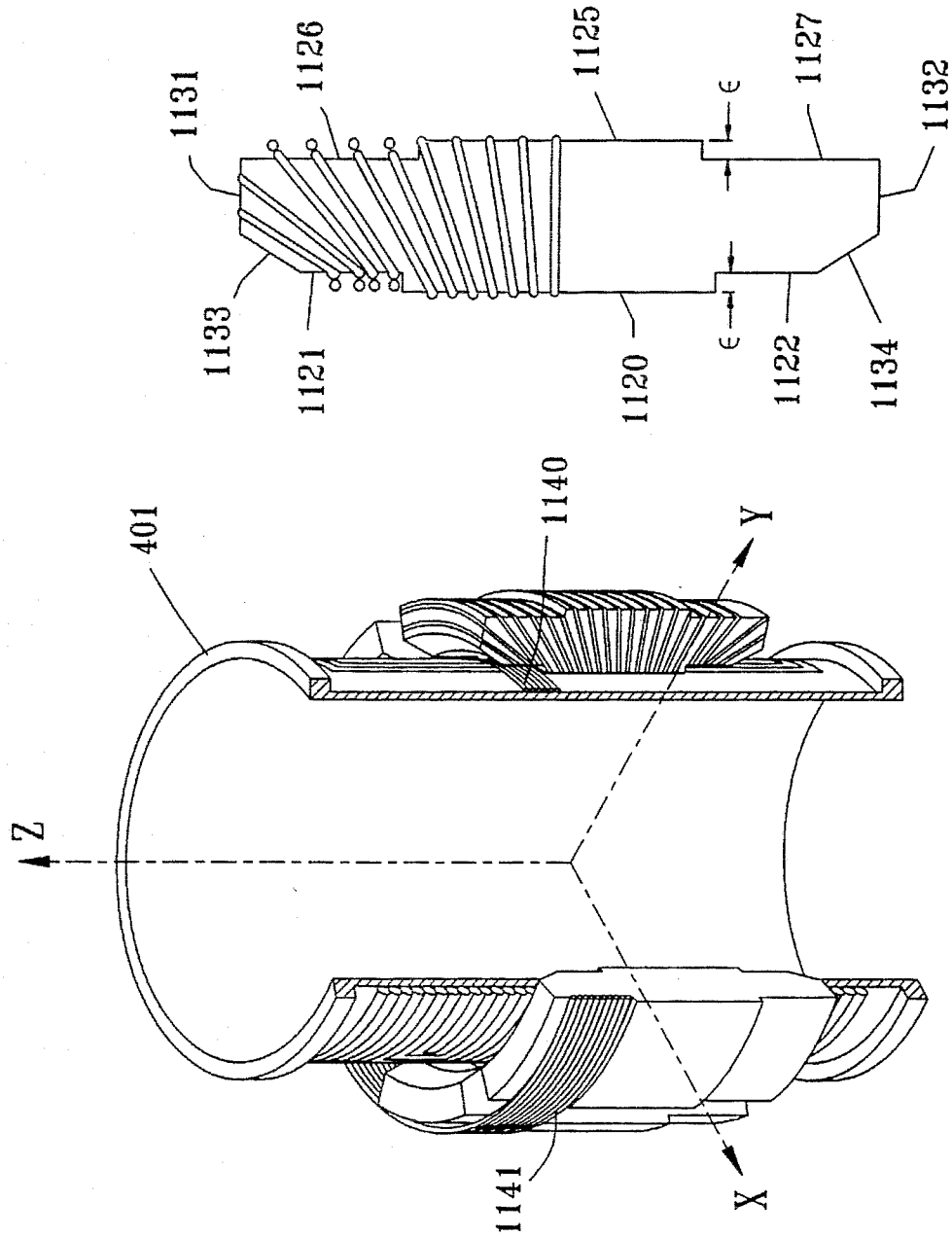
FIGS. 11a–11b are an embodiment of the invention with a stepped shape.

The crescent concept as a means of confining magnetic flux may be extended to more complex geometries with some additional improvement in both switching efficiency and shielding effectiveness but with increased complexity in the Biot-Savart numerical optimization, the manufacturing of the coilform, and in the coil winding or etching process. FIG. 11 shows one such extension of the crescent concept. The external concave cylindrical surface is symmetrically stepped to form a mid-external concave cylindrical surface 1120 with radius $r_g$ and two symmetrically located end-external concave cylindrical surfaces 1121, 1122 at radius $r_g+\epsilon$, where $\epsilon$ is small compared to $r_g$, so that the azimuthal windings on surfaces 1121, 1122, may overlap other coils on system coilform 401 at these axial locations. For example, it may be desirable to have a Z gradient winding 140 in this location to improve the linearity of the Z gradient. In such case of a Z gradient 1141 would desirably fit in stepped area 1126 and 1127. The external convex cylindrical surface may also be symmetrically stepped to form a mid-external convex cylindrical surface 1125 at radius $r_g+s$ and two symmetrically located end-external convex cylindrical surfaces 1126, 1134, at radius $r_g+s-\epsilon$. The crescent ends include annular sectors 1131, 1132, on which are mounted end-azimuthal conductors. Portions of hyperbolic surfaces of revolution 1133, 1134 join the end annular sectors to the end-concave cylindrical surfaces. Among the surfaces with azimuthal current conductors, the mean surface current density would be highest on the end-external concave cylindrical surfaces and lowest on the annular sectors. The windings of the crescent coil are desirably angled as shown in FIG. 11($b$) so as to enhance flux confinement, thus, minimizing axial flux leakage and eddy currents in the magnet.

Although this invention has been described herein with reference to specific embodiments, it will be recognized that changes and modifications may be made without departing from the spirit of the present invention. All such modifications and changes are intended to be included within the scope of the following claims.

We claim:

1. An MRI transverse gradient coil system, referenced in a spherical coordinate system, substantially symmetric with respect to the equatorial plane $\Theta=90°$ and substantially symmetric with respect to the longitudinal planes $\phi=0°$ and $\phi=90°$, said system comprising;

a nonmetallic, nonmagnetic cylindrical coilform of outer radius $r_g$ and inner radius $r_3$;

a plurality of electrically conductive surface loops bonded to the outer surface of said coilform, said loops centered at polar angle less than 60°;

a plurality of axially aligned crescent coils bonded to the outer surface of said coilform at polar angle greater than 70°;

each said crescent coil comprising:
      a nonmetallic, nonmagnetic, crescent coilform having an external concave surface composed of a section of a cylinder of a radius approximately equaling $r_g$ and axial length $h_1$ parallel to the crescent coilform axis, said crescent coilform defining an opposite external surface; said crescent coilform substantially symmetric with respect to a plane containing said coilform axis;
      external conductive loops wound around said crescent coilform axis and bonded to said external surfaces to form azimuthally oriented parallel conductor elements on said concave surface and said opposite surface the conductor elements on each face defining a turns density, such that the mean turns density on said concave surface is higher than the mean turns density on said opposite surface;
      further characterized by having a diagonal crescent coil with coilform axis positioned at 45°, an x-center crescent coil with coilform axis positioned at 0°, and a y-center crescent coil with coilform axis positioned at 90°.

2. The transverse gradient coil system of claim 1 further characterized in that $h_1$ is is greater than $r_g/2$ and less than $1.5\,r_g$.

3. The transverse gradient coil system of claim 1 further characterized by having an x-center crescent coil with coilform axis positioned at 0°, a y-center crescent coil with coilform axis positioned at 90°, and 4n off-axis crescent coils, where n is a positive integer.

4. The transverse gradient coil system of claim 3 further characterized in that one of said center crescent coils has lower inductance than one of said off-axis crescent coils.

5. The transverse gradient coil system of claim 1 further characterized in that said diagonal crescent coils each have two parallel windings.

6. The coil system of claim 1 in which said coil support cylinder comprises a high-strength, high-modulus, high-thermal-conductivity, thin-walled cylinder and is water cooled on its inner surface.

7. The system of claim 1 wherein the cylindrical coilform comprises silicon nitride.

8. The system of claim 1 wherein the cylindrical coilform comprises alumina.

9. The system of claim 1 wherein the cylindrical coilform comprises an alumina-filled composite.

10. The system of claim 1 wherein the crescent coilform is made of glass-filled polyphthalamide.

11. The system of claim 1 wherein the crescent coilform is made of a sialon.

12. The system of claim 3 wherein n is 1, wherein there are two x-center crescent coils diametrically opposed, wherein there are two y-center crescent coils diametrically opposed, the x-center and y-center crescent coils defining on-axis crescent coils, and wherein the four off-axis crescent coils alternate with the four on-axis crescent coils thus defining diagonal crescent coils, further characterized in that said diagonal crescent coils each have first and second parallel windings.

13. The system of claim 12 wherein the x-center crescent coils are electrically driven with the first windings of the diagonal crescent coils, and wherein the y-center crescent coils are electrically driven with the second windings of the diagonal crescent coils.

14. The system of claim 13 wherein the crescent coils are electrically driven by first and second amplifiers, the first amplifier receiving an x-signal and driving the x-center crescent coils and the first windings of the diagonal crescent coils, and the second amplifier receiving a y-signal and driving the y-center crescent coils and the second windings of the diagonal crescent coils.

15. The system of claim 3 wherein n is 1, wherein there are two x-center crescent coils diametrically opposed, wherein there are two y-center crescent coils diametrically opposed, the x-center and y-center crescent coils defining on-axis crescent coils, and wherein the four off-axis crescent coils alternate with the four on-axis crescent coils thus defining diagonal crescent coils.

16. The system of claim 15 wherein the crescent coils are electrically driven by first, second, third, and fourth amplifiers, the first amplifier receiving an x-signal and driving the x-center crescent coils, the second amplifier receiving a y-signal and driving the y-center crescent coils, the third amplifier receiving substantially a first linear function of the x-signal and y-signal and driving two diametrically opposed diagonal crescent coils, and the fourth amplifier receiving substantially a second linear function of the x-signal and y-signal and driving the other diagonal crescent coils.

17. The system of claim 16 wherein the first linear function is substantially the square root of two times the sum of the x-signal and y-signal, and the second linear function is substantially the square root of two times the difference of the x-signal and y-signal.

18. The crescent coil of claim 1 wherein the loops are bonded to the coilform using a fiber-reinforced thermosetting material.

19. An MRI transverse gradient coil system, referenced in a spherical coordinate system, substantially symmetric with respect to the equatorial plane $\Theta=90°$ and substantially symmetric with respect to the longitudinal planes $\phi=0°$ and $\phi=90°$, said system comprising:

a nonmetallic, nonmagnetic cylindrical coilform of outer radius $r_g$ and inner radius $r_3$;

a plurality of electrically conductive surface loops bonded to the outer surface of said coilform, said loops having a mean polar angle less than 60°;

a plurality of axially aligned crescent coils bonded to the outer surface of said coilform at polar angle greater than 70°;

each said crescent coil comprising:
a nonmetallic, nonmagnetic crescent coilform having an external concave surface composed of a section of a cylinder of a radius approximately equaling $r_g$ and axial length $h_1$ parallel to the crescent coilform axis, said crescent coilform defining an opposite external surface;

said crescent coilform substantially symmetric with respect to a plane containing said coilform axis;

external conductive loops wound around said crescent coilform axis and bonded to said external surfaces to form azimuthally oriented parallel conductor elements on said concave surface and said opposite surface the conductor elements on each face defining a turns density, such that the mean turns density on said concave surface is higher than the mean turns density on said opposite surface;

further characterized by having an x-center crescent coil with coilform axis positioned at 0°, a y-center crescent coil with coilform axis positioned at 90°, and 4n off-axis crescent coils, where n is a positive integer.

20. The transverse gradient coil system of claim 19 further characterized in that $h_1$ is greater than $r_g/2$ and less than 1.5 $r_g$.

21. The transverse gradient coil system of claim 19 further characterized in that one of said center crescent coils has lower inductance than one of said off-axis crescent coils.

22. The coil system of claim 19 in which said coil support cylinder comprises a high-strength, high-modulus, high-thermal-conductivity, thin-walled cylinder and is water cooled on its inner surface.

23. The system of claim 19 wherein the cylindrical coilform comprises silicon nitride.

24. The system of claim 19 wherein the cylindrical coilform comprises alumina.

25. The system of claim 19 wherein the cylindrical coilform comprises an alumina-filled composite.

26. The system of claim 19 wherein the crescent coilform is made of glass-filled polyphthalamide.

27. The system of claim 19 wherein the crescent coilform is made of a sialon.

28. The crescent coil of claim 19 wherein the loops are bonded to the coilform using a fiber-reinforced thermosetting material.

29. The system of claim 19 wherein n is 1, wherein there are two x-center crescent coils diametrically opposed, wherein there are two y-center crescent coils diametrically opposed, the x-center and y-center crescent coils defining on-axis crescent coils, and wherein the four off-axis crescent coils alternate with the four on-axis crescent coils thus defining diagonal crescent coils, further characterized in that said diagonal crescent coils each have first and second parallel windings.

30. The system of claim 29 wherein the x-center crescent coils are electrically driven with the first windings of the diagonal crescent coils, and wherein the y-center crescent coils are electrically driven with the second windings of the diagonal crescent coils.

31. The system of claim 30 wherein the crescent coils are electrically driven by first and second amplifiers, the first amplifier receiving an x-signal and driving the x-center crescent coils and the first windings of the diagonal crescent coils, and the second amplifier receiving a y-signal and driving the y-center crescent coils and the second windings of the diagonal crescent coils.

32. The system of claim 19 wherein n is 1, wherein there are two x-center crescent coils diametrically opposed, wherein there are two y-center crescent coils diametrically opposed, the x-center and y-center crescent coils defining on-axis crescent coils, and wherein the four off-axis crescent coils alternate with the four on-axis crescent coils thus defining diagonal crescent coils.

33. The system of claim 32 wherein the crescent coils are electrically driven by first, second, third, and fourth amplifiers, the first amplifier receiving an x-signal and driving the x-center crescent coils, the second amplifier receiving a y-signal and driving the y-center crescent coils, the third amplifier receiving substantially a first linear function of the x-signal and y-signal and driving two diametrically opposed diagonal crescent coils, and the fourth amplifier receiving substantially a second linear function of the x-signal and y-signal and driving the other diagonal crescent coils.

34. The system of claim 33 wherein the first linear function is substantially the square root of-two times the sum of the x-signal and y-signal, and the second linear function is substantially the square root of two times the difference of the x-signal and y-signal.

35. The system of claim 19 wherein n is 2, wherein there are two x-center crescent coils diametrically opposed, wherein there are two y-center crescent coils diametrically opposed, the x-center and y-center crescent coils defining on-axis crescent coils, and wherein the eight off-axis crescent coils are disposed pairwise between pairs of x-center and y-center crescent coils, the eight off-axis crescent coils defining four diametrically opposed pairs.

36. The system of claim 35 wherein the crescent coils are electrically driven by first, second, third, fourth, fifth and sixth amplifiers, the first amplifier receiving an x-signal and driving the x-center crescent coils, the second amplifier receiving a y-signal and driving the y-center crescent coils, the third amplifier receiving substantially a first linear function of the x-signal and y-signal and driving a first pair of diametrically opposed off-axis crescent coils, the fourth amplifier receiving substantially a second linear function of the x-signal and y-signal and driving a second pair of diametrically opposed off-axis crescent coils, the fifth amplifier receiving substantially a third linear function of the x-signal and y-signal and driving a third pair of diametrically opposed off-axis crescent coils, and the sixth amplifier receiving substantially a fourth linear function of the x-signal and y-signal and driving a fourth pair of diametrically opposed off-axis crescent coils.

37. The system of claim 36 wherein the first linear function is substantially the square root of three times the x-signal divided by two, summed with half of the y-signal, the second linear function is substantially half of the x-signal summed with the square root of three times the y-signal divided by two, the third linear function is substantially the square root of three times the x-signal divided by two, minus half of the y-signal, and the fourth linear function is substantially half of the x-signal, minus the square root of three times the y-signal divided by two.

* * * * *